(12) United States Patent
Chen et al.

(10) Patent No.: US 10,903,366 B1
(45) Date of Patent: Jan. 26, 2021

(54) FORMING FIN-FET SEMICONDUCTOR STRUCTURES

(71) Applicant: Taiwan Semiconductor Manufacturing Co., Ltd., Hsinchu (TW)

(72) Inventors: Sheng-Chieh Chen, Taichung (TW); Ming-Chyi Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/573,888

(22) Filed: Sep. 17, 2019

(51) Int. Cl.
*H01L 29/78* (2006.01)
*H01L 27/1157* (2017.01)
*H01L 29/66* (2006.01)
*H01L 29/792* (2006.01)
*H01L 29/423* (2006.01)
*H01L 21/28* (2006.01)

(52) U.S. Cl.
CPC ...... *H01L 29/7851* (2013.01); *H01L 27/1157* (2013.01); *H01L 29/40117* (2019.08); *H01L 29/42344* (2013.01); *H01L 29/66795* (2013.01); *H01L 29/66833* (2013.01); *H01L 29/792* (2013.01)

(58) Field of Classification Search
CPC ..... H01L 21/823431; H01L 21/823437; H01L 21/823456; H01L 21/823821; H01L 21/823828; H01L 21/82385; H01L 27/115; H01L 27/11563; H01L 27/1214; H01L 27/1218; H01L 27/1222; H01L 27/1248; H01L 27/1259; H01L 27/127; H01L 29/40117; H01L 29/4232; H01L 29/4234; H01L 29/66477; H01L 29/66742; H01L 29/66795; H01L 29/66833; H01L 29/772; H01L 29/78; H01L 29/785; H01L 29/7851; H01L 29/7856; H01L 29/792
See application file for complete search history.

(56) References Cited

U.S. PATENT DOCUMENTS

2016/0284702 A1* 9/2016 Park ................ H01L 21/823864

* cited by examiner

*Primary Examiner* — Cheung Lee
(74) *Attorney, Agent, or Firm* — Seed IP Law Group LLP (57) ABSTRACT

A process is provided to fabricate a finFET device. A gate electrode layer is positioned over a dielectric layer. The gate electrode layer and the dielectric layer are both positioned over and surrounding a fin-shaped semiconductor structure. A gate electrode is formed from the gate electrode layer through a two-step patterning process. At a first patterning step, an upper portion of the gate electrode layer is patterned. Then a dielectric film is formed covering the patterned upper portion of the gate electrode layer. After the dielectric film is formed, a second patterning process is performed to pattern a lower portion of gate electrode layer.

20 Claims, 12 Drawing Sheets

FORMING FIN-FET SEMICONDUCTOR STRUCTURES

BACKGROUND

Embedded memory refers to any non-stand-alone memory, which is integrated on-chip with logic cores and other components in system-on-chip ("SOC") integrated circuits ("IC"). An embedded memory supports a logic core to accomplish intended functions. High performance and reliability embedded memory units are key components in very-large-scale-integration ("VLSI") SOCs like microcontrollers, because of its high-speed and wide bus-width capability. For example, use of an embedded memory eliminates inter-chip communication, which is a major source of delay.

Embedded flash memory made from the split-gate metal oxide nitride oxide silicon ("SG-MONOS") has been proven to have fast program speed and high reliability. A memory cell of a SG-MONOS device includes a select gate ("SG") and a memory gate ("MG"). A trap layer of oxide-nitride-oxide is positioned between the select gate and the semiconductor body, which stores charges therein. Various combinations of logic power supply, position high voltage, and negative high voltage are provided to the select gate, the memory gate, the source and the drain in the read, program or the erase operations of the SG-MONOS memory cell.

FinFET SG-MONOS devices further improve gate control and scalability over the traditional planar SG-MONOS devices.

BRIEF DESCRIPTION OF THE SEVERAL VIEWS OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Techniques in accordance with embodiments described herein are directed to a novel process to fabricate a finFET MONOS device having improved memory gate sidewall profile.

The disclosed techniques are directed to semiconductor wafer fabrication processes and semiconductor structures that provide an improved surface profile of the select gate and/or the memory gate of a SG-MONOS device.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Figure 1:
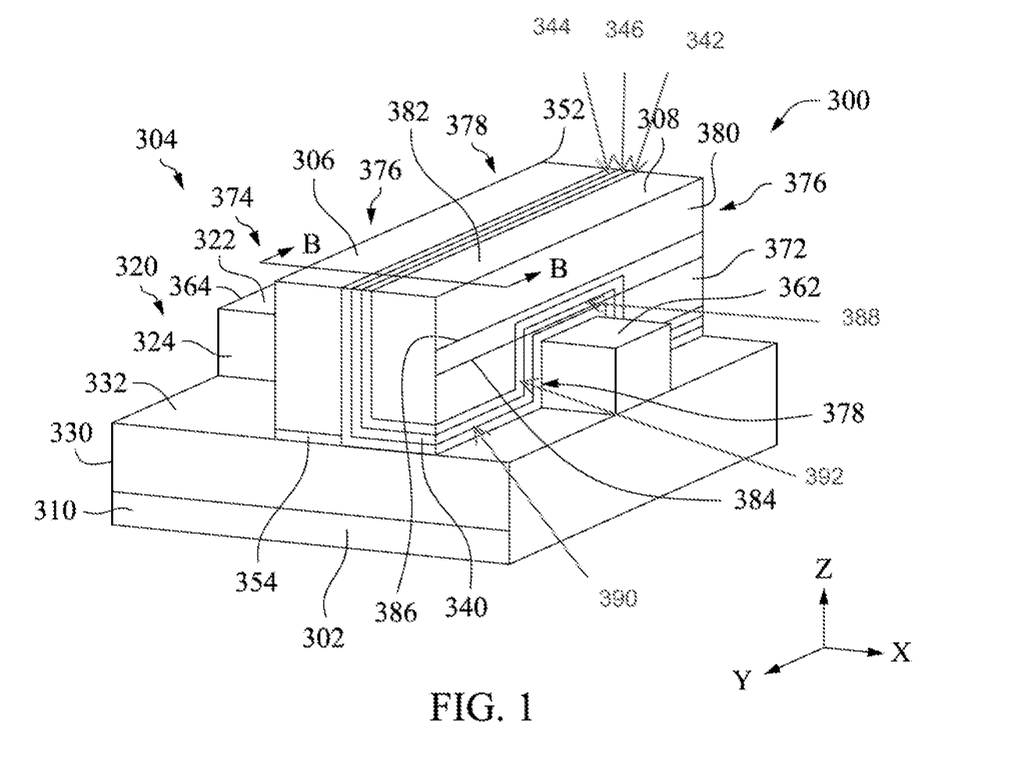
FIG. 1 illustrates a perspective view of an example structure.
Figure 2:
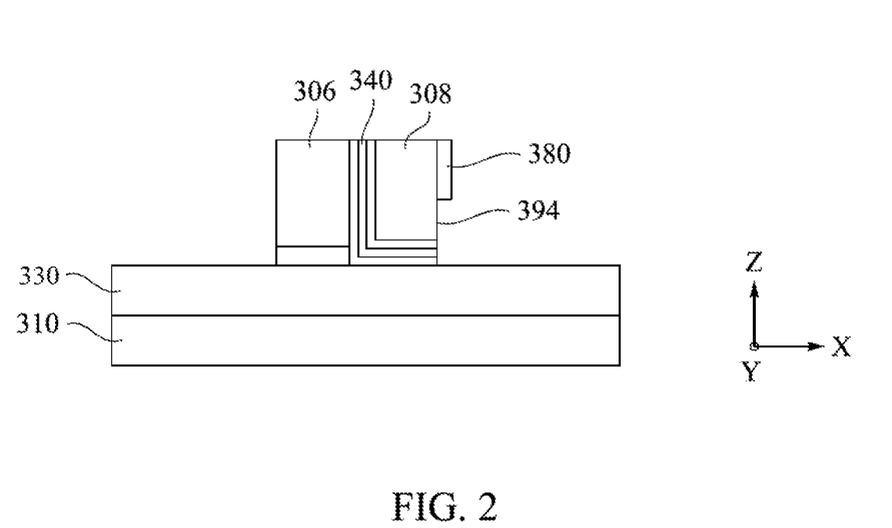
FIG. 2 illustrates a cross-sectional view of the structure of FIG. 1.

FIG. 1 shows a perspective view of an example SG-MONOS structure 300. FIG. 2 shows a cross-sectional view of the example SG-MONOS structure 300 from cutting-line B-B. As shown in FIGS. 1 and 2, structure 300 includes a substrate 302 and a device 304 formed over the substrate 302. The substrate 302 includes a fin structure 320 extending upward from the substrate 302. The fin structure 320 may include a same semiconductor material as the substrate 302 or may include a different semiconductor material. In an embodiment, the substrate 302 and the fin structure 320 are silicon. An insulation layer 330 is positioned over the substrate 302 and adjacent to, e.g., sounding, the fin structures 320. At least for some portions of the insulation layer 3330, an upper surface 332 of the insulation layer 330 is lower than an upper surface 322 of the fin structure 320.

The device 304 includes two gate structures 306 and 308 both wrapping around or surrounding at least three surfaces of the fin structure 320, e.g., the upper surface 322 and two sidewall surfaces 324 of the fin structure 320. In a SG-MONOS configuration, the gate structure 306 is configured as a select gate ("SG") or a control gate. The gate structure 308 is configured as a memory gate ("MG"). A charge trapping or charge storage layer 340 ("trap layer") is positioned below and beside the MG 308. The trap layer 340 separates the MG 308 from the SG 306 in a first lateral direction, here the x-axis direction, and separates the MG 308 from the insulation layer 330 in a vertical direction, here the z-axis direction. The trap layer 340 separates the MG 308 from the fin structure 320 in the vertical z-axis direction and in a second lateral direction, here the y-axis direction. The trap layer 340 includes a laminate structure of two silicon oxide films 342, 344 and a silicon nitride film 346 sandwiched between the two silicon oxide films 342, 344. That is, the trap layer 340 is an O-N-O laminate structure.

The SG 306 includes a gate electrode 352 and a gate dielectric 354 between the gate electrode 352 and the fin structure 320. The MG 308 may or may not include a gate dielectric layer. That is, the trap layer 340 may function as a charge trapping layer as well as a gate dielectric layer.

The fin structure 320 may include a source region 362 and a drain region 364. The source region 362 and the drain region 364 are positioned adjacent to an edge surface 372, 374 of the SG 306 or the MG 308, respectively. FIGS. 1 and 2 shows that the source region 362 is adjacent to the edge surface 372 of the MG 308 and the drain region 364 is adjacent to the edge surface 374 of the SG 306, as an illustrative example. The positions of the source region 362 and the drain region 364 may be switched, under different programming schemes to store charges in the trap layer 340.

To some extent, the device 310 includes two transistors, a select transistor and a memory transistor, sharing the source region 362 and the drain region 364. A channel region 376 for the select transistor is a portion of the fin structure 320 adjacent to or wrapped by the SG 306. A channel region 378 for the memory transistor is a portion of the fin structure 320 adjacent to or wrapped by the MG 308.

An upper spacer structure ("upper spacer") 380 is positioned adjacent to an upper portion 376 of the edge surface 372 of the MG 308. In an embodiment, the upper spacer 380 extends vertically from an upper surface 382 of the MG 308 to a point between the trap layer 340 and the upper surface 322 of the fin structure 320, or specifically the upper surface 322 of the source region 362 of the fin structure 320. That is, a bottom edge 384 of the upper spacer 380 is higher than or substantially at a same level with the upper surface 322 of the fin structure 320. The bottom edge 384 of the upper spacer 380 is lower than or substantially at a same level with the trap layer 340.

In other embodiment, the upper spacer 380 may extend vertically from an upper surface 378 of the MG 308 to a point either above the trap layer 340 or below the upper surface 322 of the fin structure 320. That is, the bottom edge 384 of the upper spacer 380 may be higher than the trap layer 340 or lower than the upper surface 322 of the fin structure 320.

In another embodiment, a top edge 386 of the upper spacer structure 380 may be lower than the upper surface 322 of the fin structure 320.

In various embodiments, the top edge 386 of the upper spacer structure 380 is higher than a portion 388 of the trap layer 340 that is positioned over the upper surface 322 of the fin structure 320. The bottom edge 384 of the upper spacer 380 is higher than a portion 390 of the trap layer 340 that is positioned over insulation layer 330. A vertical space 392 is maintained between the upper spacer structure 380 and the insulation layer 330. The vertical space 392 ensures that the source region 362 (or drain region) is sufficiently exposed to receive doping, e.g., through ion implantation.

In an embodiment, the bottom edge 384 of the upper spacer structure 380 is higher than or substantially at a same level as the portion 392 of the trap layer 340 that is positioned over the upper surface 322 of the fin structure 320.

With the upper spacer structure 380 covering the covering an upper portion of the edge surface 372, a lower portion 394 of the edge surface 372 that is exposed from the upper spacer structure 380 may be patterned separately from the patterning of the upper portion. Resultantly, the lower portion 394 of the edge surface 372 does not extend beyond the upper spacer structure 380 in the x-axis direction. That is, the lower portion 394 of the edge surface 372 recedes inward with respect to the upper spacer structure 380. In an embodiment, the lower portion 394 is substantially plumb, as shown in FIGS. 1 and 2.

Figure 3:
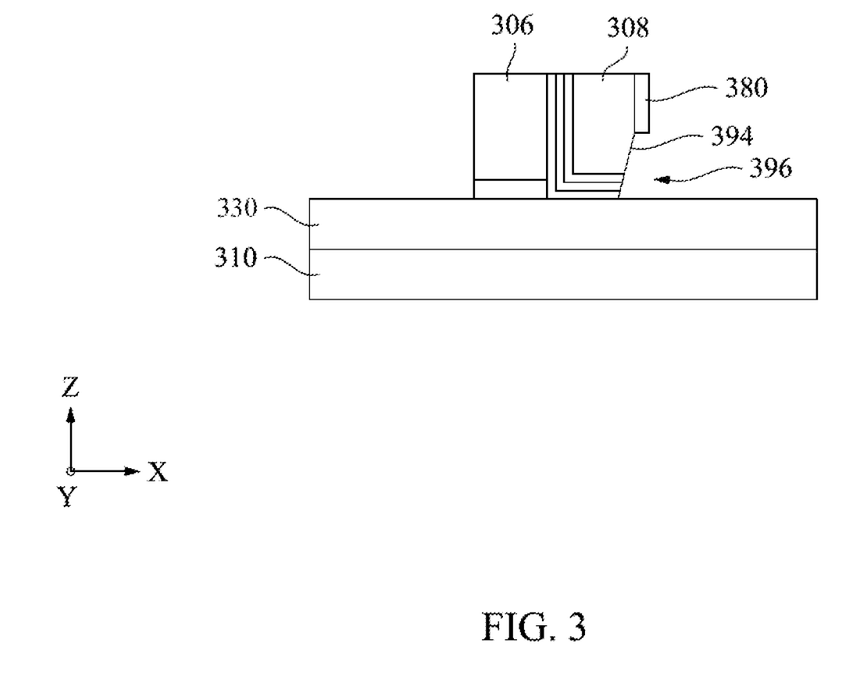
FIG. 3 illustrates another example structure.

In another embodiment, as shown in FIG. 3, the lower portion 394 is reverse tapered. An undercut region 396 is formed between the lower portion 394 and the insulation layer 330.

The upper spacer structure 380 is silicon nitride, silicon oxide or other suitable dielectric materials.

In an embodiment, an upper spacer structure 398 may be positioned adjacent to an edge surface of the SG 306. The structural and positioning features of the upper spacer structure 398 may be similar to those of the upper spacer structure 380. Detailed description of the upper spacer structure 398 is omitted herein for simplicity purposes.

Figure 4:
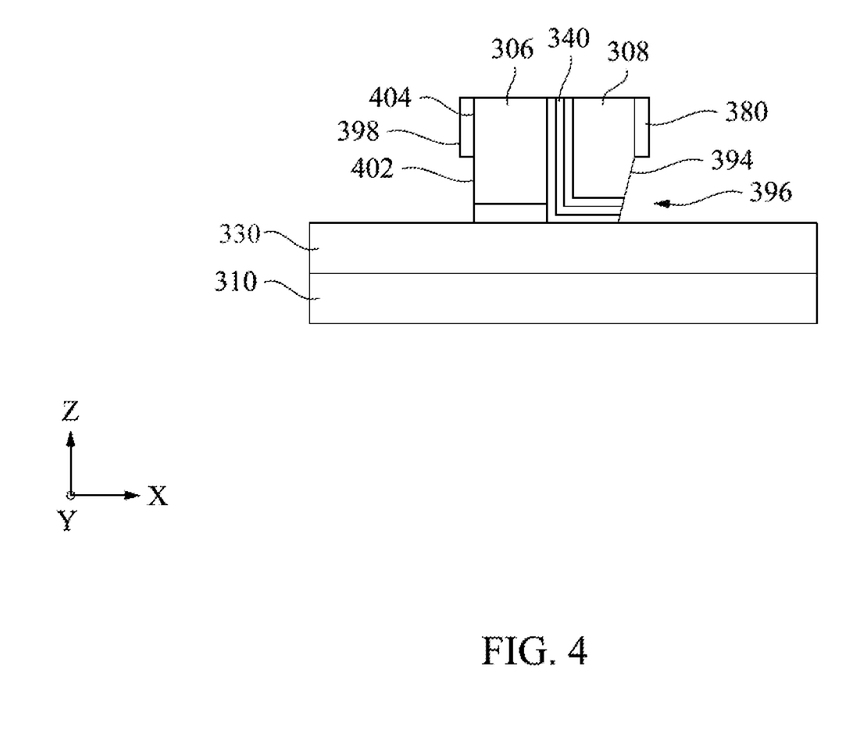
FIG. 4 illustrates another example structure.

In another embodiment, as shown in FIG. 4, an upper spacer structure 398 is positioned adjacent to an upper portion 404 of an edge surface 402 of the SG 306. The upper spacer structure 398 is silicon nitride, silicon oxide or other suitable dielectric materials.

Figure 5:
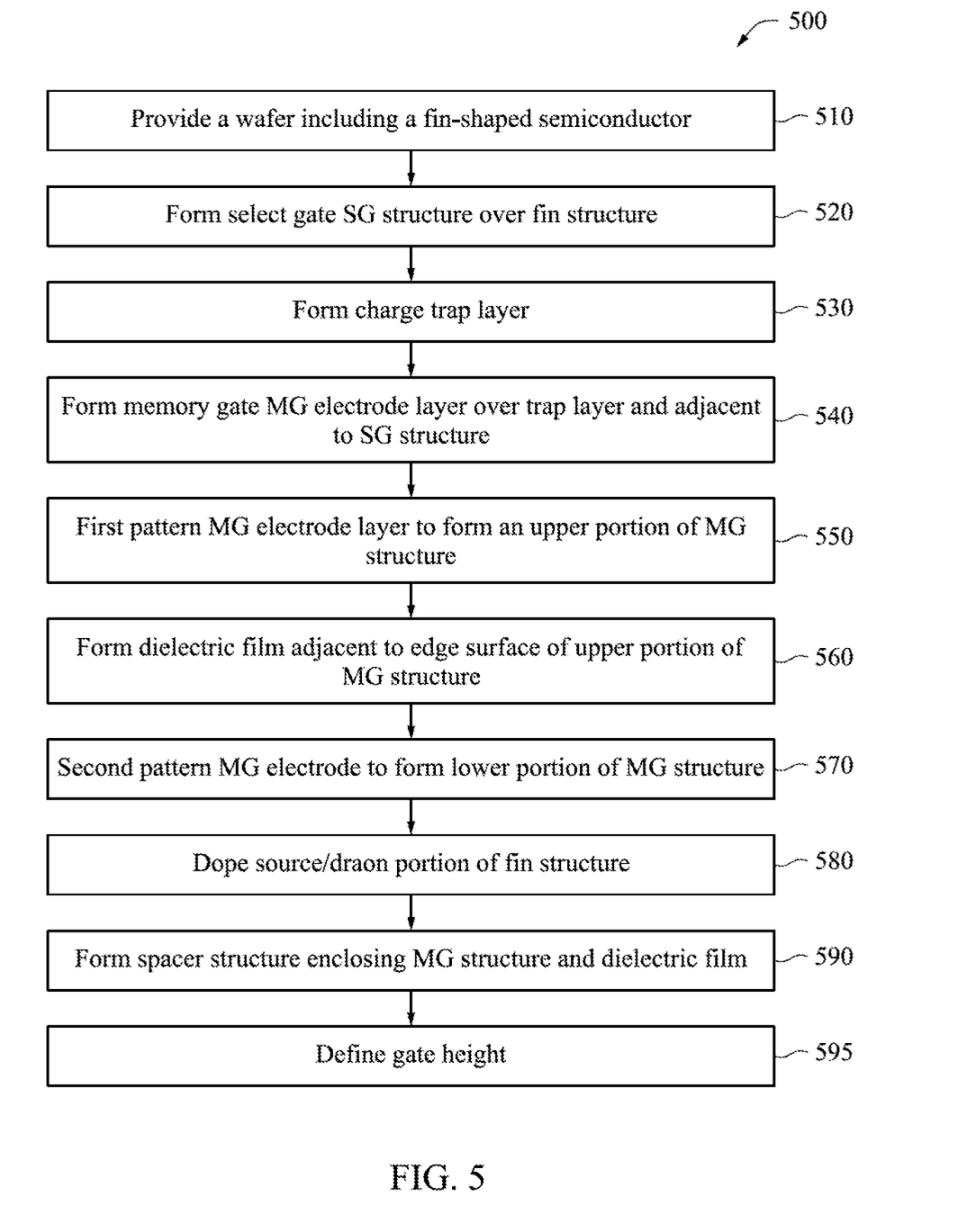
FIG. 5 illustrates an example process.

FIG. 5 is a flow diagram of an example process 500 for making the example structure 300 or other semiconductor structures. FIGS. 6-15 show a wafer 600 in various fabrication stages of the example process 500. Referring to FIG. 5, with reference also to FIG. 6, in example operation 510, a wafer 600 is provided. The wafer 600 includes a substrate 610, e.g., of silicon, silicon germanium, and/or other suitable semiconductor materials. For example, the substrate 610 may include a compound semiconductor such as silicon carbide, gallium arsenide, indium arsenide, and/or indium phosphide. Further, the substrate 610 may also include a silicon-on-insulator (SOI) structure.

Figure 6:
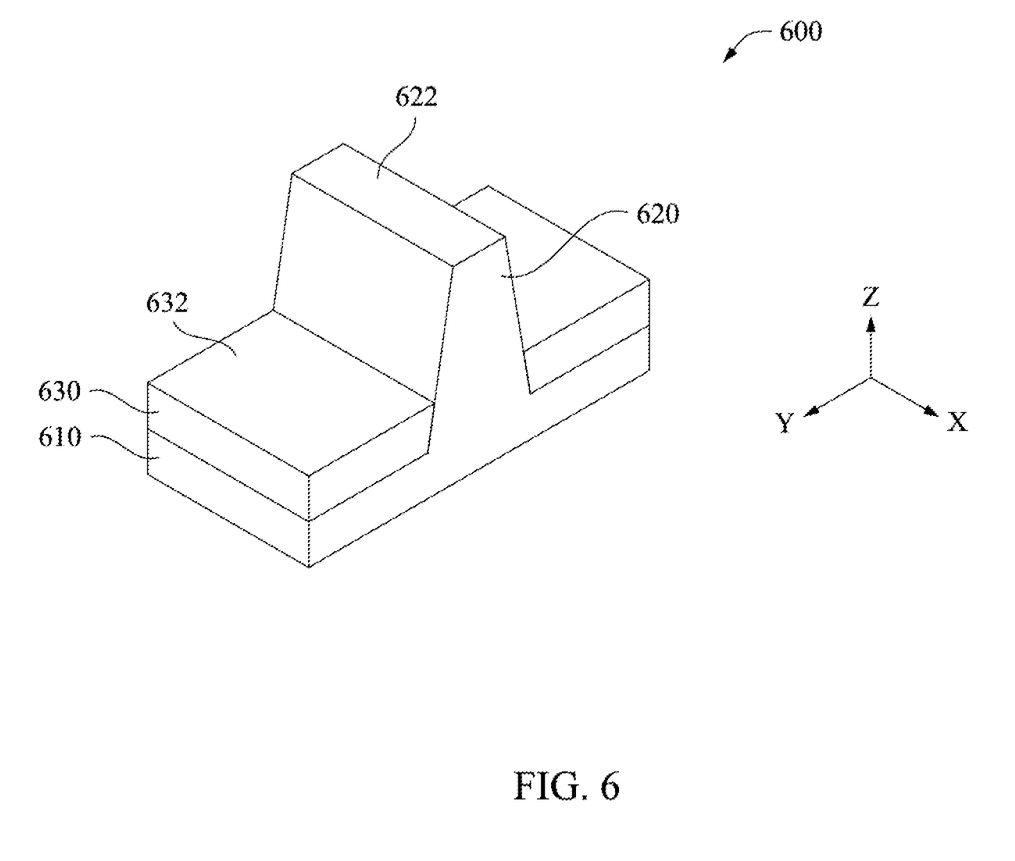
FIGS. 6-15 illustrate a wafer in various stages of fabrication under the example process of FIG. 5.

A vertical fin-shaped structure 620 is positioned over the substrate 610. In an embodiment, the fin-shaped structure ("fin structure") 620 may extend directly from the substrate 610. For example, the fin structure 620 may be formed by patterning the substrate 610. The fin structure 620 may also be formed through an epitaxy process over the substrate 610. For example, a dielectric layer may be formed and patterned to form a trench over the substrate 610 to define a dimension of the fin structure 620. The fin structure 620 may be formed through an epitaxy process within the trench.

In another embodiment, an insulation layer is positioned between the fin structure 620 and the substrate 610. The insulation layer may be formed over the substrate 610 or may be included in the substrate 610 as a buried oxide layer ("BOX"). For example, a silicon-on-insulator ("SOP") wafer 600 can be used, which is supplied with a BOX layer already formed. SOI wafers are standard starting materials commonly used in the semiconductor industry.

In the description herein, as an illustrative example, the fin structure 620 extends directly from the substrate 610. The fin structure 620 may include a same semiconductor material as the substrate 610 or may include a different semiconductor material. In a case that the fin structure 620 includes a same semiconductor material as the substrate 610, the semiconductor material of the fin structure 620 may include a different crystallinity or facial orientation from that of the substrate 610. The fin structure 620 may be formed from the substrate 610 through patterning or may be grown from the substrate 610 through an epitaxy process. The epitaxy fin structure 620 may be each may be doped in various approaches with various dopants/impurities, like arsenic, phosphorous, boron, gallium, indium, antimony, oxygen, nitrogen, or various combinations thereof.

The wafer 600 also includes an insulation layer 630 adjacent to the fin structure 620. An upper surface 632 of the insulation layer 630 is lower than an upper surface 622 of the fin structure 620, with respect to the substrate 610. The insulation layer 630 is silicon oxide, silicon nitride or other suitable dielectric material. In some embodiments, an etch stop layer (not shown) is formed between the insulation layer 630 and the substrate 610 and between the insulation 630 and the fin structure 620. The etch stop layer is a different dielectric material from the insulation layer 630, e.g., the etch stop layer 420 is silicon nitride in a case that the insulation layer 630 is silicon oxide. In an embodiment, the insulation layer 630 and the etch stop layer (if any) are adjacent to the lower fin portion of the fin structure 620, and an upper portion of the fin structure 620 is exposed from the insulation layer 630 and the etch stop layer. In the description herein, the exposed upper portion of the fin structure 620 is also referred to as the "fin structure" 620 without differentiation from the fin structure 620 as a whole.

Figure 7:
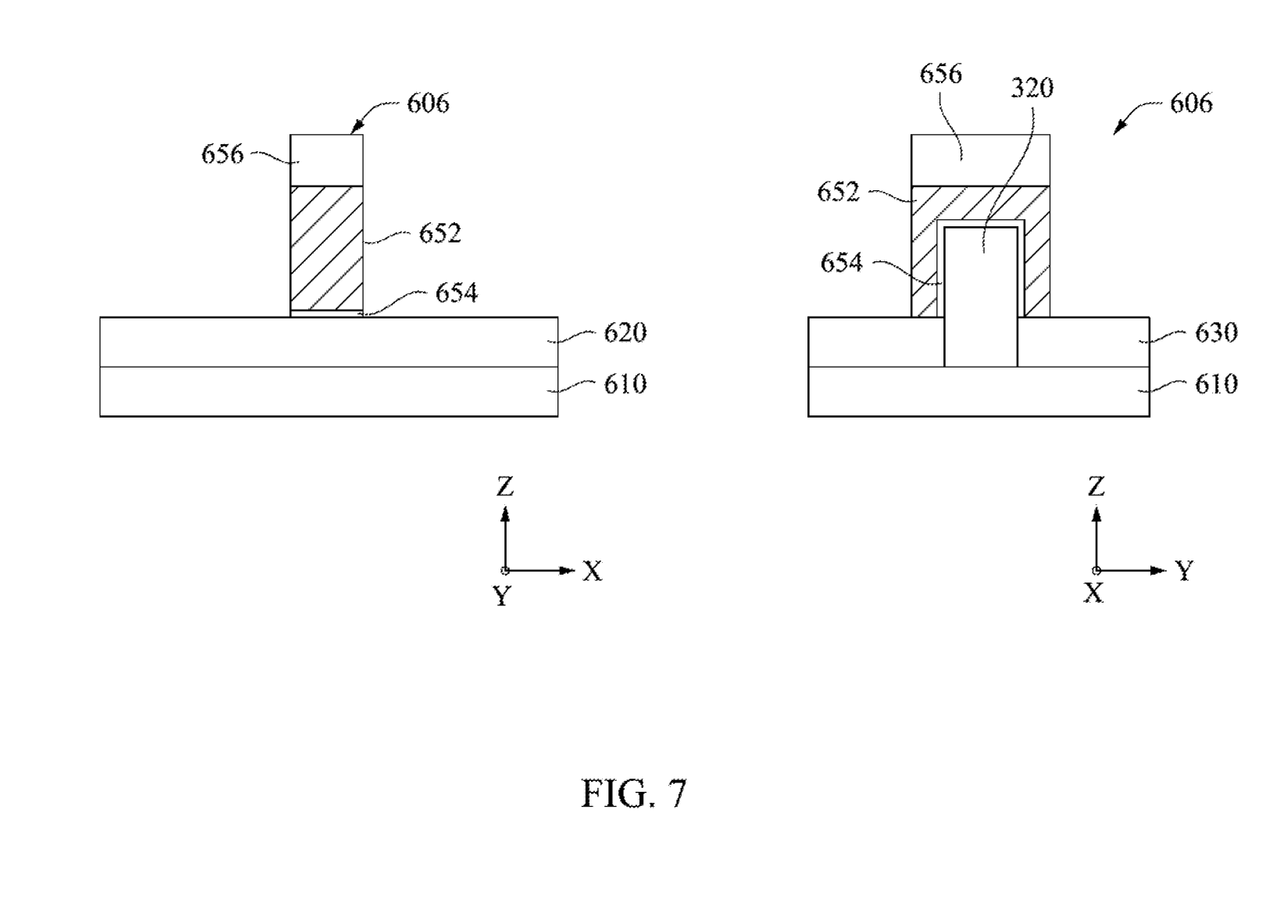

In example operation 520, with reference also to FIG. 7, a select gate 606 is formed over the fin structure 620. In an embodiment, the select gate SG 606 is formed to be adjacent to or surround three surfaces of the fin structure 620. In an embodiment, the SG 606 may include a gate electrode layer 652 and a gate dielectric layer 654 between the gate electrode layer 652 and the fin structure 620. The SG 606 may also include a gate cap layer (not shown for simplicity), and one or more liner layer (not shown for simplicity). The cap layer and/or the liner layer may be silicon oxide, silicon nitride or other suitable dielectric materials.

In an embodiment, the gate dielectric layer 654 and the gate electrode layer 652 may be first blankly formed over the fin structure 620 and the insulation layer 630, and then may be patterned to form the SG 606. A hard mask HM or photoresist layer 656 used in the patterning of the blanks layers may remain on top of the SG 606 as shown in FIG. 7.

Figure 8:
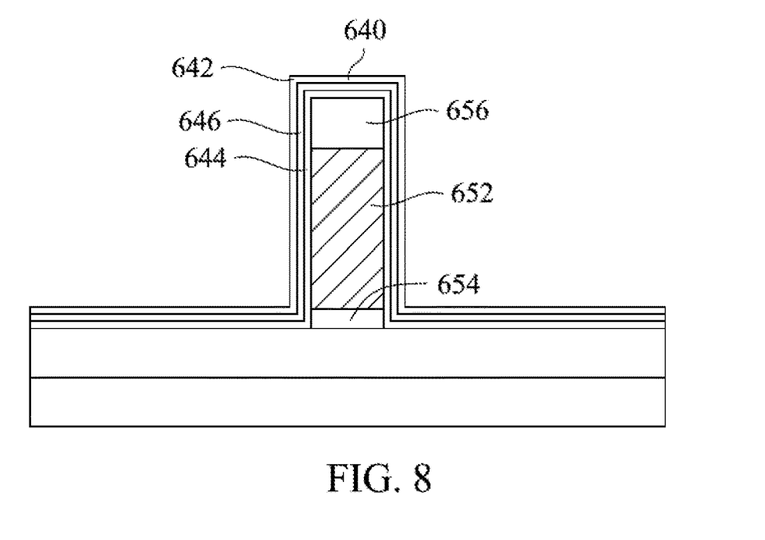

In example operation 530, with reference also to FIG. 8, a charge trap layer 640 is formed blankly over wafer 600. Specifically, the trap layer 640 is formed over the HM layer 656, the SG 606, the fin structure 620, and the insulation layer 630. In an embodiment, the trap layer 640 include a first silicon oxide layer 642, a second silicon oxide layer 644 and a silicon nitride layer 646 sandwiched between the first silicon oxide layer 642 and the second silicon oxide layer 644. The first silicon oxide layer 642, the second silicon oxide layer 644, and the silicon nitride layer 646 may be formed via a thin film process or other suitable deposition processes.

Figure 9:
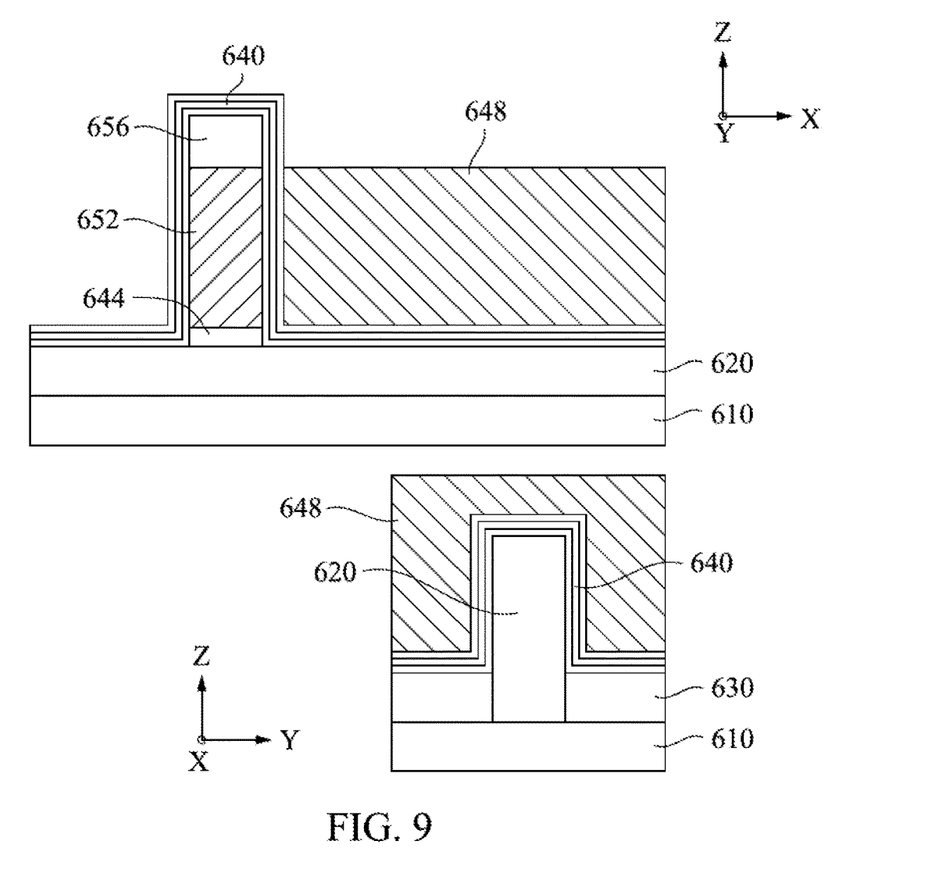

In example operation 540, with reference also to FIG. 9, a memory gate MG electrode layer 648 is formed over the trap layer 640 and adjacent to the SG structure 606. In an embodiment, the MG electrode layer 648 is polysilicon or other suitable conductive materials.

Figure 10:
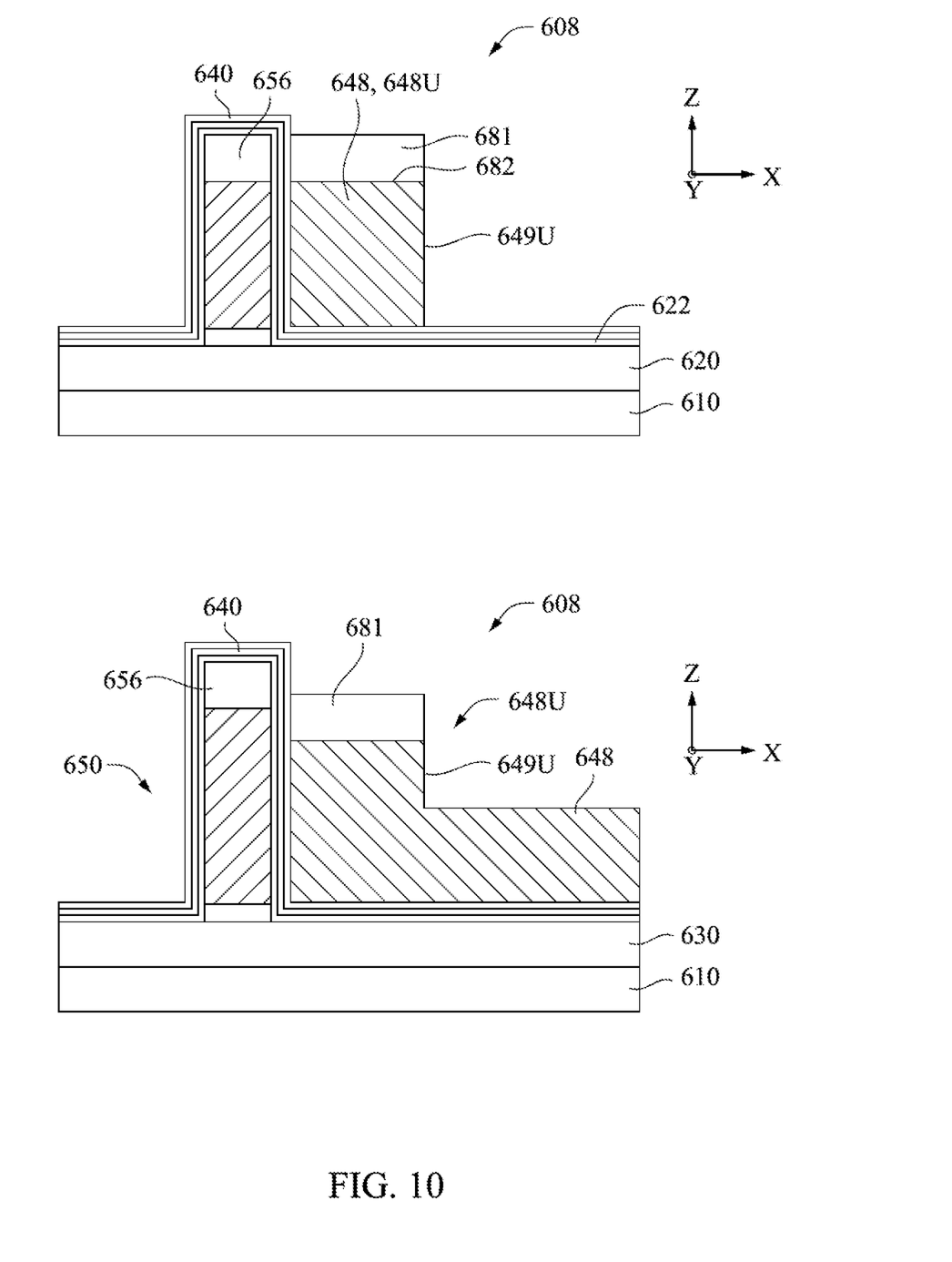

In example operation 550, with reference also to FIG. 10, a first patterning process is performed to form an upper portion 648U of a MG structure 608. In an embodiment, the upper portion 648U extends vertically from an upper surface 682 of the MG electrode layer 648 to the trap layer 640 over the upper surface 622 of the fin structure 620. In other embodiments, the upper portion 648U may extend to a point higher than the trap layer 640 or lower than the upper surface 622 of the fin structure 620.

In forming the upper portion 648U, the first patterning process, e.g., a dry etching processing, is tuned to form the profile of the edge surface 649U of the upper portion 648U. The conditions of the dry etching process do not need to consider the profile of an edge surface of an lower portion of the MG structure 608 because the lower portion of the MG structure 608 has not yet been formed. Because the etch conditions for the upper portion 648U is not compromised by the depth differences between the insulation layer 630 and the fin structure 620, the profile of the edge surface 649U can be formed more satisfactorily. In an embodiment, the edge surface 649U is substantially plumb.

Figure 11:
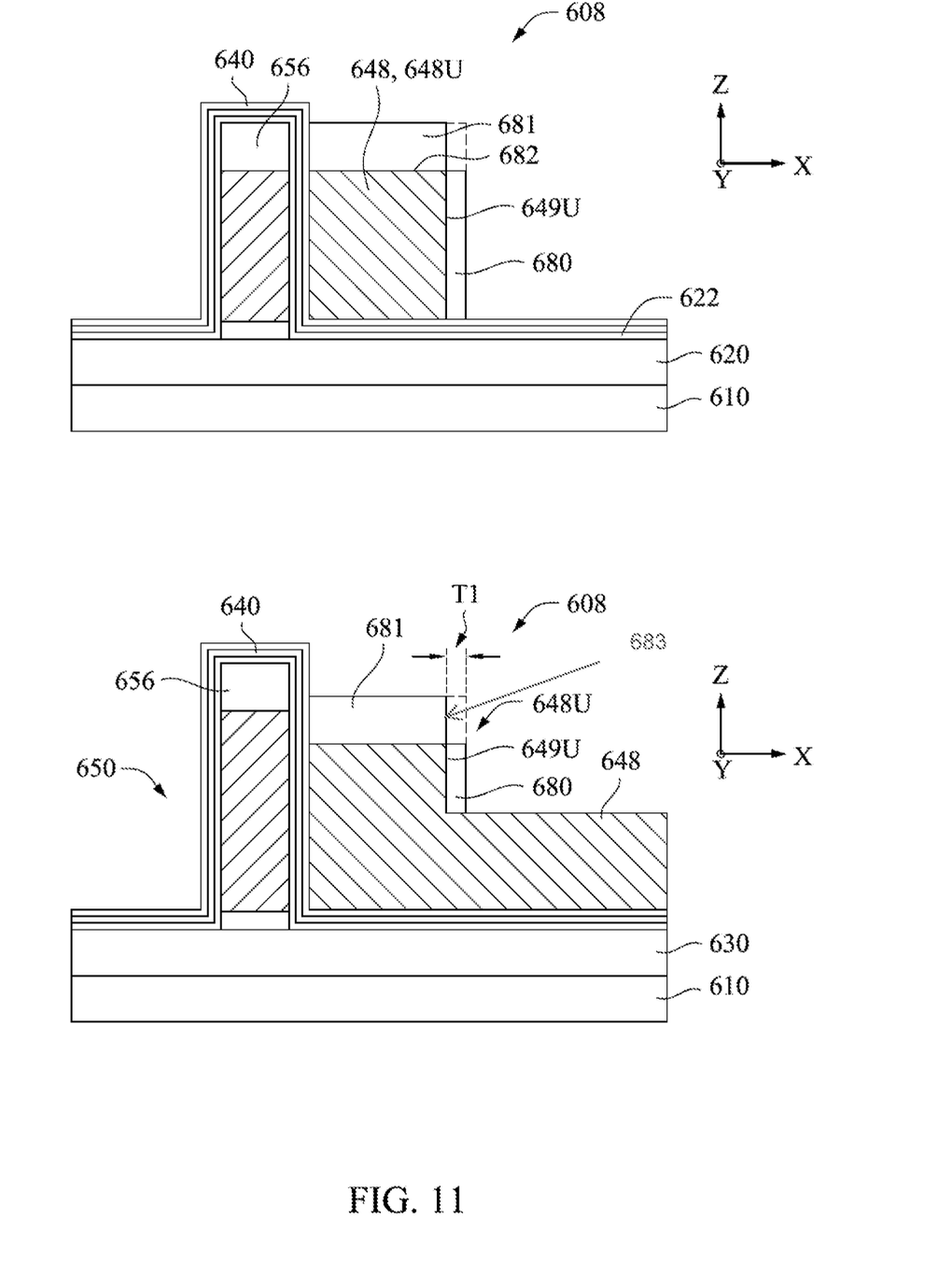

In example operation 560, with reference also to FIG. 11, a dielectric film 680 of a dielectric material is formed adjacent to the edge surface 649U of the upper portion 648U of the MG structure 608. Specifically, the dielectric film 680 covers, in a lateral x-axis direction, the edge surface 649U. The dielectric film 680 may be formed using a thin film process or other suitable processes.

As shown in FIG. 11, a hard mask layer 681 used for patterning the upper portion 648U may remain in the operation 560. As such, the upper surface 682 of the upper portion 648U is protected by the hard mask 681. The dielectric film 680 may also be initially formed to extend on the edge surface 683 of the hard mask layer 681, as shown in dotted line on FIG. 11. This initially formed extra extension of the dielectric film 680 helps to ensure that the edge surface 649U of the upper portion 648U will not be impacted by a subsequent process, e.g., a process that forms a lower portion of the MG structure 608.

A thickness T1 of the dielectric film 680 is selected and controlled based on the device design and/or the process design, e.g., the dimensions of the MG structure 608, the height of the upper portion 648U, or the etch process used to form the lower portion of the MG structure 608. In an embodiment, the thickness T1 of the dielectric film 680 is controlled to be sufficiently thin such that the dimension variation between the upper portion 648U and the lower portion of the MG structure 608 is minimized. In an embodiment, the thickness T1 is in a range between about 1 nm to about 10 nm. In another embodiment, the thickness T1 is in a range between about 2 nm to about 5 nm.

Figure 12:
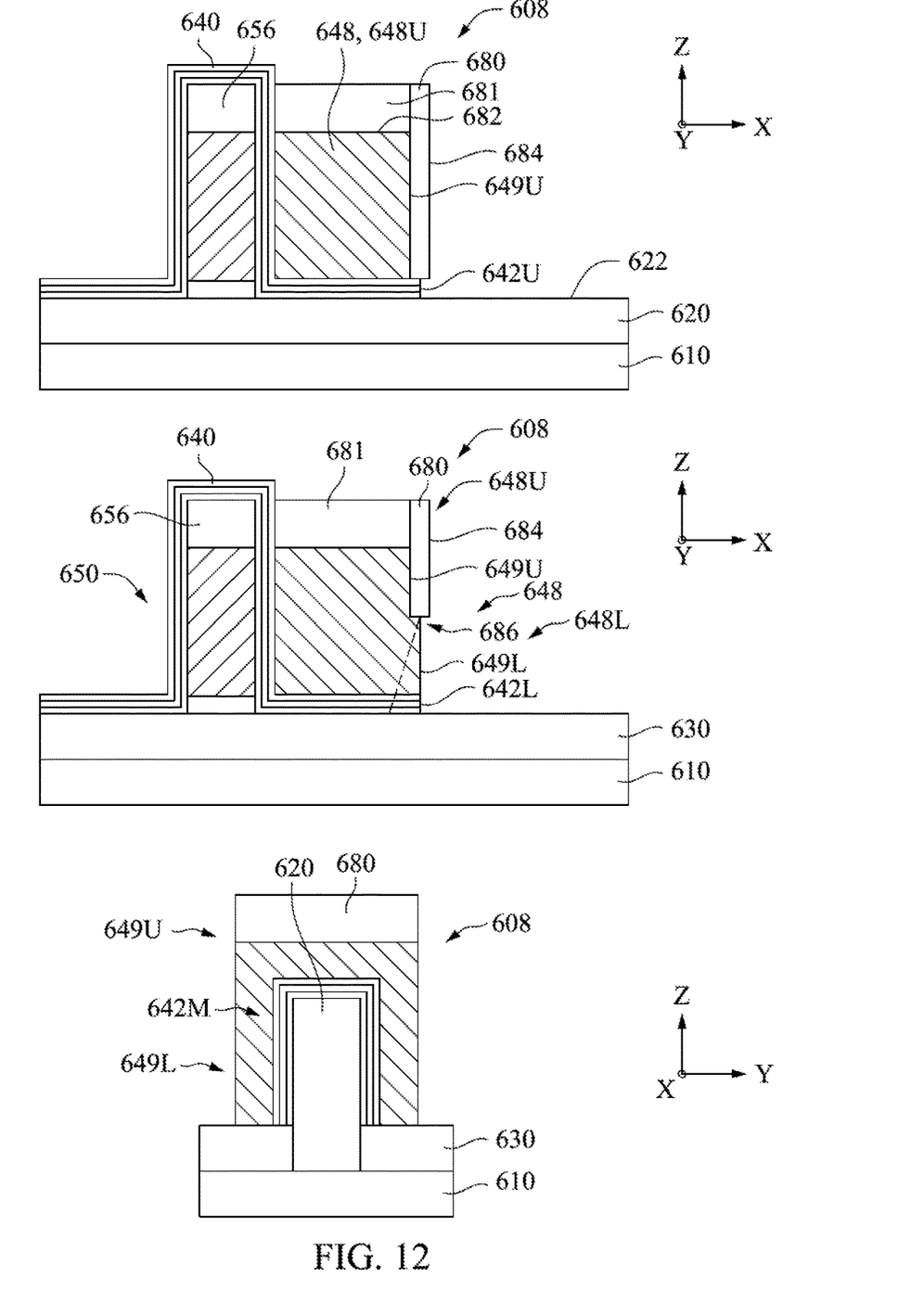

In example operation 570, with reference also to FIG. 12, after the dielectric film 680 is formed, a second patterning process is performed to form the lower portion 648L of the MG structure 608. The lower portion 648L extends from the upper portion 648U until reaching the trap layer 640 on the insulation layer 630. In an embodiment, an edge surface 649L of the lower portion 648L is substantially plumb or reversely tapered (as shown in dotted line in FIG. 12). That is, the edge surface 649L of the lower portion 648L does not protrude beyond an outer edge surface 684 of the dielectric film 680. In an embodiment, an undercut portion 686 is formed between the dielectric film 680 and the edge surface 649L of the lower portion 648L. In an embodiment, the edge surface 649L of the lower portion 648L is substantially in vertical alignment with the edge surface 649U of the upper portion 648U.

Because the edge surface 649U is covered by the dielectric film 680, the conditions of the second patterning process, e.g., a second dry etching process, is selected and controlled to perfect the profile of the edge surface 649L without compromise toward balancing the profile of the edge surface 649U of the upper portion 648U.

In an embodiment, in the example operation 570, the trap layer 640 is also patterned to be in vertical alignment with the lower portion 648L of the MG structure 608. More specifically, a lower edge surface 642L of the trap layer 640 over the insulation layer 630 is substantially plumb with the edge surface 649L of the lower portion 648L. An upper edge surface 642U of the trap layer 640 over the fin structure 620 is also substantially plumb with the edge surface 649L of the lower portion 648L.

In some other embodiments, a part of the trap layer 640 over the fin structure 620 is patterned together with the upper portion 648U in the first patterning process of the operation 550. As such the upper edge surface 642U of the trap layer 640 over the fin structure 620 is substantially plumb with the edge surface 649U of the upper portion 648U, and is covered laterally by the dielectric film 680. After the second patterning process of the operation 570, the lower edge surface 642L of the trap layer 640 over the insulation layer 630 is substantially plumb with the edge surface 649L of the lower portion 648L.

As described herein, the edge surface 649L of the lower portion 648L is either plumb or reversely tapered, and does not protrude beyond the dielectric film 680. Being aligned vertically with the edge surface 649L, the edge surface 642L of the trap layer 640 also does not protrude beyond the dielectric film 680.

After the second patterning, a sidewall edge surface 642M is in lateral alignment with the edge surface 649L of the lower portion 648L. The sidewall edge surface 642M of the trap layer 640 also does not protrude beyond the dielectric film 680.

Figure 13:
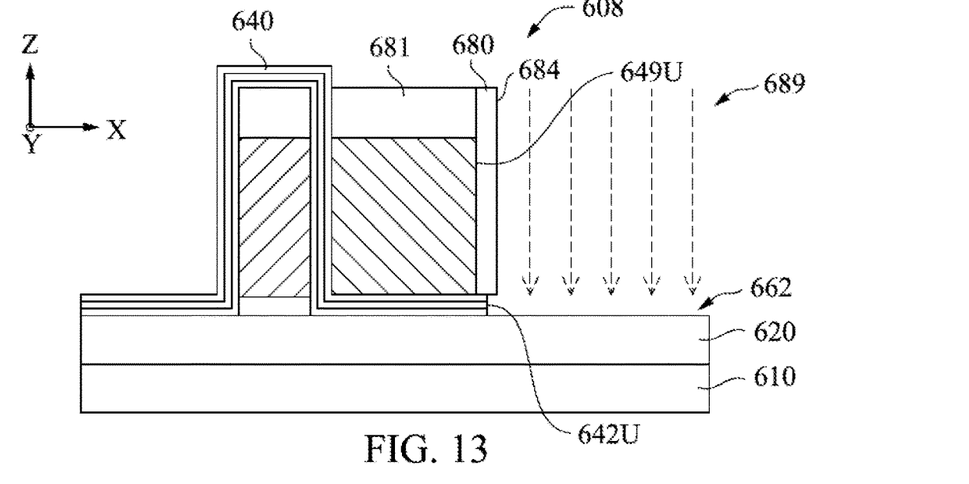

In example operation 580, with reference also to FIG. 13, a doping process 689 is performed on a first source/drain portion 662 of the fin structure 620. The first source/drain portion 662 is adjacent to the MG structure 608. In an embodiment, the source/drain portion 662 is designed and controlled to be outside of the dielectric film 680. Because the edge surfaces 642U, 642L, and 642M each do not protrude beyond the dielectric layer edge surface 649L of the lower portion 648L, the dopants introduced into the trap layer 640 is substantially reduced or even eliminated.

In example operation 580, a second source/drain portion that is adjacent to the SG structure 606 may also be doped.

Figure 14:
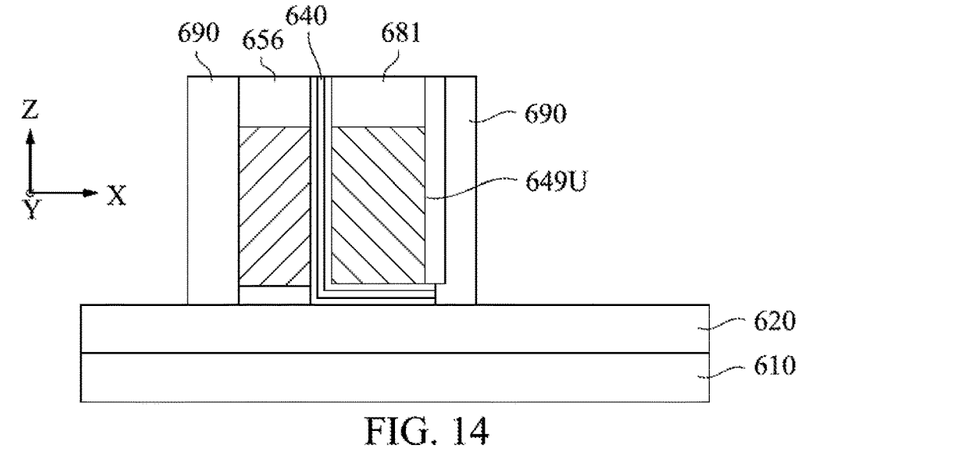

Further, the trap layer 640 may be further patterned to remain only below the MG electrode layer 648 and between the MG electrode layer 648 and the SG structure 606 (FIG. 14).

In example operation 590, with reference also to FIG. 14, optionally, a spacer structure 690 is formed surrounding the SG structure 606 and the MG structure 608. The dielectric film 680 is enclosed within the spacer structure 690 and between the edge surface 649U of the upper portion 648U and the spacer structure 690. The dielectric film 680 may be configured as an upper spacer structure covering only the upper portion 648U of the MG structure 608 that is formed from the MG electrode layer 648.

Figure 15:
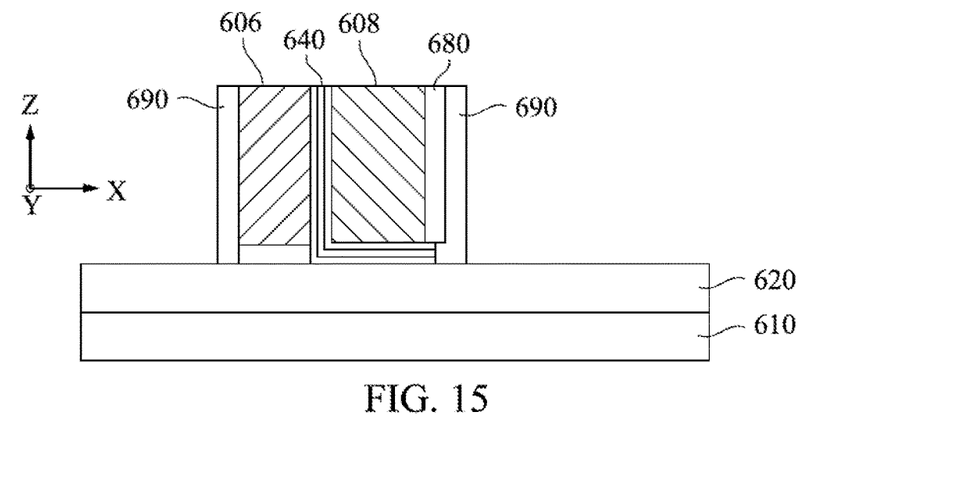

In example operation 595, with reference also to FIG. 15, gate heights for the SG structure 606 and the MG structure 608 are defined. The hard mask layers 681 are removed from the top of the SG structure 606 and the MG structure 608. For one or more of the SG structure 606 and the MG structure 608, an upper portion of the gate structure may also be removed to define the gate height. FIG. 14 shows that the SG structure 606 and the MG structure 608 have a substantially same height, which is ab illustrative example. The SG structure 606 and the MG structure 608 may have different heights.

After the gate height is defined for the MG structure 608, at least a portion of the dielectric film 680 may remain adjacent to the upper portion 648U.

As described herein, the edge surface 649U, 649L of the MG structure 608 are formed separately using a two-step process, and a dielectric film 680 is formed adjacent to the edge surface 649U before the edge surface 649L is formed. This two-step process helps to reduce or eliminate dopant contamination of the charge trap layer 640. Very similar processes can be used to form the edge surface of the SG structure 606. Similarly, a dielectric layer may be formed adjacent to an upper portion of the SG structure 606 over the upper surface 622 of the fin structure 620. A lower portion of the SG structure 606 does not protrude beyond the dielectric layer. Resultantly, less dopants will be introduced into the gate dielectric layer 654 in the doping process of the source/drain portion 664.

Figure 16:
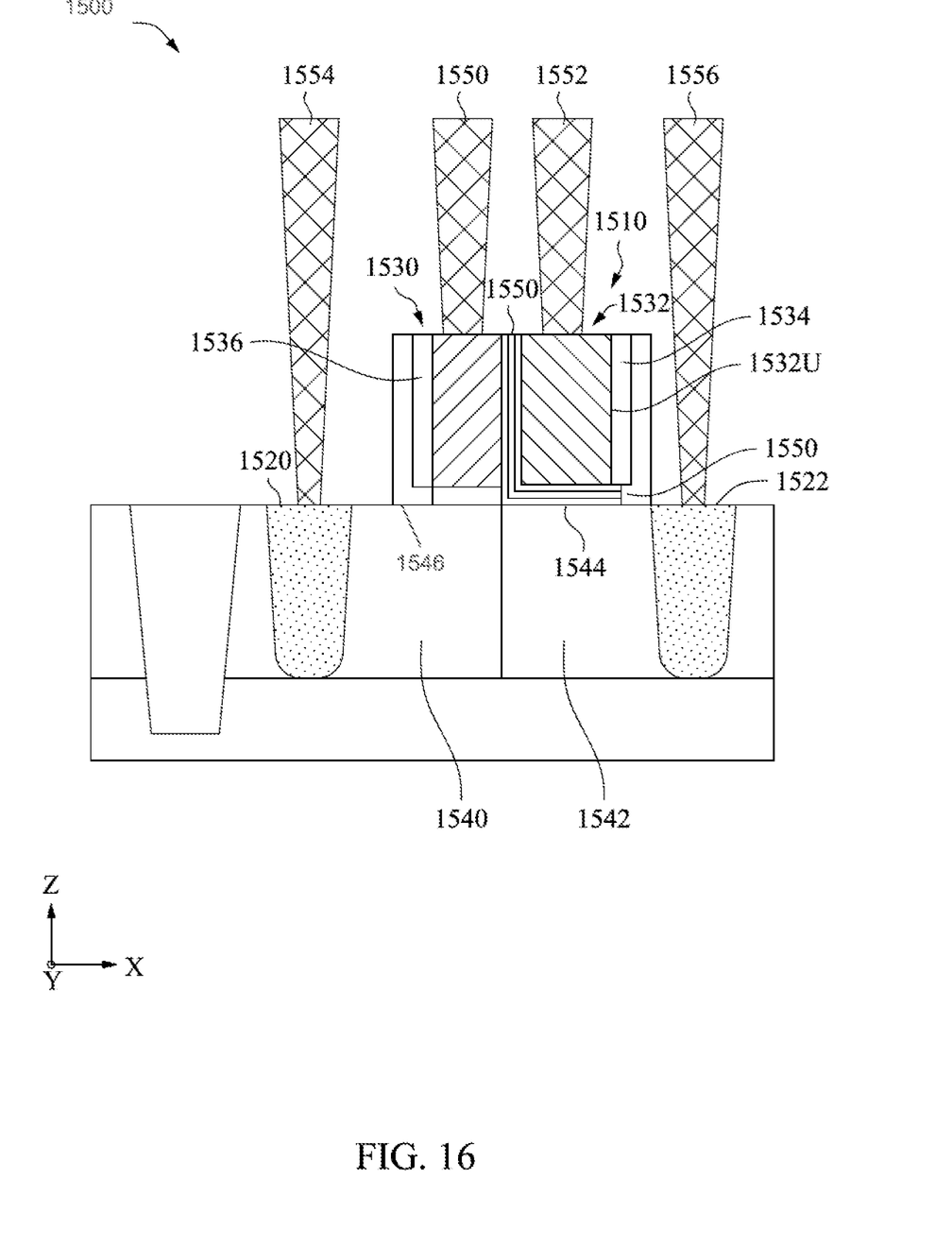
FIG. 16 illustrates an example integrated circuit having a SG-MONOS unit.

FIG. 16 shows an integrated circuit ("IC") device 1500. The IC device 1500 includes an embedded SG-MONOS memory unit 1510. The SG-MONOS memory unit 1510 includes a first source/drain structure 1520, a second source/drain structure 1522, a SG 1530, a MG 1532, a first fin-shaped channel 1540, and a second fin-shaped channel 1542. The first source/drain structure 1520 and the second source/drain structure 1522 are connected to the first fin-shaped channel 1540 and a second fin-shaped channel 1542, respectively. The SG 1530 and the MG 1532 are formed over the first fin-shaped channel 1540 and a second fin-shaped channel 1542, respectively. A charge storage layer 1550 is positioned between the MG 1532 and the fin-shaped channel 1542. A dielectric film 1534 is positioned adjacent an upper portion 1532U of the MG 1532 over an upper surface 1544 of the fin-shaped channel 1542. A dielectric layer 1536 is positioned adjacent an upper portion of the SG 1530 over an upper surface 1546 of the first fin-shaped channel 1540. The SG 1530, the MG 1532 each does not protrude beyond the dielectric layer 1536, the dielectric layer 1534, respectively, in the x-axis direction. Interconnection structures 1550, 1552 are coupled to the SG 1530 and the MG 1532, respectively. Interconnection structures 1554, 1556 are coupled to the first source/drain structure 1520 and the second source/drain structure 1522, respectively.

In operation, various electrical potentials are applied to the SG 1530, the MG 1532, the first source/drain structure 1520 and the second source/drain structure 1522 to achieve read, program or erase operations of the SG-MONOS memory unit 1510. For example, in a read operation, the second source/drain structure 1522 may be grounded, and relatively small positive voltages of, for example, about 1V may be applied to the SG 1530, the MG 1532, and the first source/drain structure 1520. The first fin-shaped channel 1540 may be influenced by the electrical charges stored at the charge storage layer 1550, so that a current that is representative of the data stored in the SG-MONOS unit 1510 flows between the first source/drain structure 1520 and the second source/drain structure 1522.

For write operation, charge carriers may be injected through the second source/drain structure 1522 into the charge storage layer 1550. For example, the first source/drain structure 1620 may be grounded, and a relatively high positive voltage of, for example, about 5V, may be applied to the second source/drain structure 1522. A higher positive voltage of, for example, 10V may be applied to the MG 1532. A voltage slightly greater than the threshold voltage of the first fin-shaped channel region 1540 may be applied to the SG 1530.

Other programming schemes may be used in the read, write and erase operations of the SG-MONOS unit 1510, which are all included in the disclosure.

The present disclosure may be further appreciated with the description of the following embodiments:

In some embodiments, a structure includes a substrate and a fin-shaped semiconductor structure over the substrate. An insulation layer is positioned over the substrate and laterally adjacent to the fin-shaped semiconductor structure. A first gate structure is positioned over the substrate. The first gate structure includes a first portion and a second portion. The first portion is at least partially positioned over an upper surface of the fin-shaped semiconductor structure, and the second portion extends from the first portion downward toward a first surface of the insulation layer. The first surface of the insulation layer is lower than the upper surface of the fin-shaped semiconductor structure. A first dielectric film is positioned adjacent to an edge surface of the first portion of the first gate structure. The second portion of the first gate structure is exposed from the first dielectric film. An edge surface of the second portion of the first gate structure recedes inward from the first dielectric film.

In some embodiments, an integrated circuit includes a substrate and a fin-shaped semiconductor structure over the substrate. The fin-shaped semiconductor structure has an upper surface and a sidewall surface meeting the upper surface. An insulation layer is positioned over the substrate and laterally adjacent to the fin-shaped semiconductor structure. A select gate structure is positioned over the substrate. The select gate structure is adjacent to the fin-shaped semiconductor structure at the upper surface and the sidewall surface. A memory gate structure is positioned over the substrate. The memory gate structure is adjacent to the fin-shaped semiconductor structure at the upper surface and the sidewall surface. A charge storage layer is positioned between the memory gate structure and the substrate, and between the memory gate structure and the select gate structure. A first dielectric film is adjacent to an upper portion of the memory gate structure, which leaves a lower portion of the memory gate structure exposed from the first dielectric film. The lower portion of the memory gate structure is one of substantially plumb or reversely tapered with respect to the first dielectric film.

In some embodiments, a method includes receiving a wafer that has a fin-shaped semiconductor structure over a substrate. A dielectric layer is formed over the substrate and the fin-shaped semiconductor structure. A gate electrode layer is formed over the dielectric layer. The gate electrode layer surrounds the fin-shaped semiconductor structure at an upper surface of the fin-shaped semiconductor structure and two sidewall surfaces of the fin-shaped semiconductor structure. The gate electrode layer is patterned to form an upper edge surface. The upper edge surface extends from an upper surface of the gate electrode layer to a point about the upper surface of the fin-shaped semiconductor structure. A dielectric film is formed covering the upper edge surface. After the dielectric film is formed covering the upper edge surface, the gate electrode layer and the dielectric layer below the gate electrode layer are patterned to form an lower edge surface.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A structure, comprising:
   a substrate;
   a fin-shaped semiconductor structure over the substrate;
   an insulation layer over the substrate and laterally adjacent to the fin-shaped semiconductor structure;
   a first gate structure over the substrate, the first gate structure including a first portion and a second portion, the first portion being at least partially over an upper surface of the fin-shaped semiconductor structure, and the second portion extending from the first portion downward toward a first surface of the insulation layer, the first surface of the insulation layer being lower than the upper surface of the fin-shaped semiconductor structure; and
   a first dielectric film adjacent to an edge surface of the first portion of the first gate structure, the second portion of the first gate structure being exposed from the first dielectric film, an edge surface of the second portion of the first gate structure receding inward from the first dielectric film.

2. The structure of claim 1, further comprising a second dielectric film between the second portion of the first gate structure and the first surface of the insulation layer.

3. The structure of claim 2, wherein an edge surface of the second dielectric film recedes from the first dielectric film.

4. The structured of claim 2, wherein the second dielectric film includes a first oxide film, a second oxide film and a nitride film sandwiched between the first oxide film and the second oxide film.

5. The structure of claim 2, wherein the first dielectric film laterally covers a portion of the second dielectric film that is positioned over the upper surface of the fin-shaped semiconductor structure.

6. The structure of claim 2, further comprising a spacer structure adjacent to the first gate structure, the first dielectric film being enclosed between the spacer structure and the first portion of the first gate structure.

7. The structure of claim 2, further comprising a second gate structure over the substrate and adjacent to the first gate structure, the second dielectric film being positioned laterally between the first gate structure and the second gate structure.

8. The structure of claim 7, wherein the second gate structure includes a first portion and a second portion, the first portion being at least partially over an upper surface of the fin-shaped semiconductor structure, and the second portion extending from the first portion downward toward the first surface of the insulation layer, and
further comprising a third dielectric film adjacent to an edge surface of the first portion of the second gate structure, the second portion of the second gate structure being exposed from the third dielectric film, an edge surface of the second portion of the second gate structure receding inward from the third dielectric film.

9. The structure of claim 7, wherein second gate structure includes a gate electrode and a gate dielectric layer, the gate dielectric layer of the second gate structure having a different material from that of the second dielectric film.

10. The structure of claim 2, wherein a portion of the second dielectric film positioned over the upper surface of the fin-shaped semiconductor structure recedes inward from the first dielectric film.

11. An integrated circuit, comprising:
a substrate;
a fin-shaped semiconductor structure over the substrate, the fin-shaped semiconductor structure having an upper surface and a sidewall surface meeting the upper surface;
an insulation layer over the substrate and laterally adjacent to the fin-shaped semiconductor structure;
a select gate structure over the substrate, the select gate structure being adjacent to the fin-shaped semiconductor structure at the upper surface and the sidewall surface;
a memory gate structure over the substrate, the memory gate structure being adjacent to the fin-shaped semiconductor structure at the upper surface and the sidewall surface;
a charge storage layer positioned between the memory gate structure and the substrate, and between the memory gate structure and the select gate structure; and
a first dielectric film adjacent to an upper portion of the memory gate structure leaving a lower portion of the memory gate structure exposed from the first dielectric film, the lower portion of the memory gate structure being one of substantially plumb or reversely tapered with respect to the first dielectric film.

12. The integrated circuit of claim 11, further comprising an undercut portion formed between the lower portion of the memory gate structure and the first dielectric layer.

13. The integrated circuit of claim 12, further comprising a spacer structure laterally enclosing the select gate structure and the memory gate structure, the first dielectric film being enclosed between the spacer structure and the upper portion of the memory gate structure.

14. The integrated circuit of claim 11, wherein an edge surface of the charge storage layer over the upper surface of the fin-shaped semiconductor structure substantially aligns vertically with an edge surface of the upper portion of the memory gate structure.

15. The integrated circuit of claim 14, wherein the first dielectric film laterally covers the edge surface of the charge storage layer over the upper surface of the fin-shaped semiconductor structure.

16. The integrated circuit of claim 11, wherein an edge surface of the charge storage layer over the upper surface of the fin-shaped semiconductor structure substantially aligns vertically with an edge surface of the lower portion of the memory gate structure.

17. The integrated circuit of claim 11, wherein the charge storage layer includes a first oxide film, a second oxide film and a nitride film sandwiched between the first oxide film and the second oxide film.

18. A method, comprising:
receiving a wafer having a fin-shaped semiconductor structure over a substrate;
forming a dielectric layer over the substrate and the fin-shaped semiconductor structure;
forming a gate electrode layer over the dielectric layer, the gate electrode layer surrounding the fin-shaped semiconductor structure at an upper surface of the fin-shaped semiconductor structure and two sidewall surfaces of the fin-shaped semiconductor structure;
first patterning the gate electrode layer to form an upper edge surface, the upper edge surface extending from an upper surface of the gate electrode layer to a point about the upper surface of the fin-shaped semiconductor structure;
forming a dielectric film covering the upper edge surface; and
after the dielectric film is formed covering the upper edge surface, second patterning the gate electrode layer and the dielectric layer below the gate electrode layer to form an lower edge surface.

19. The method of claim 18, wherein the second patterning is controlled to form the lower edge surface to be one of substantially plumb or reversely tapered with respect to the dielectric film.

20. The method of claim 18, further comprising doping a portion of the fin-shaped semiconductor structure outside the gate electrode layer after the lower edge surface is formed.

* * * * *